(12) United States Patent
Dohi et al.

(10) Patent No.: US 9,564,893 B2
(45) Date of Patent: Feb. 7, 2017

(54) TOUCH SWITCH AND CONTROL PANEL

(71) Applicant: U-SHIN LTD., Tokyo (JP)

(72) Inventors: Izumi Dohi, Hiroshima (JP); Kazuyuki Fukushima, Hiroshima (JP)

(73) Assignee: U-SHIN LTD., Tokyo (JP)

( * ) Notice: Subject to any disclaimer, the term of this patent is extended or adjusted under 35 U.S.C. 154(b) by 93 days.

(21) Appl. No.: 14/264,255

(22) Filed: Apr. 29, 2014

(65) Prior Publication Data
US 2014/0320200 A1 Oct. 30, 2014

(30) Foreign Application Priority Data
Apr. 30, 2013 (JP) .................... 2013-095784

(51) Int. Cl.
*H03K 17/96* (2006.01)

(52) U.S. Cl.
CPC ... *H03K 17/962* (2013.01); *H03K 2217/96073* (2013.01)

(58) Field of Classification Search
CPC .... G06F 19/3418; G06F 19/345; G06F 3/044; A61B 5/0022
See application file for complete search history.

(56) References Cited

U.S. PATENT DOCUMENTS

| 2013/0021293 A1* | 1/2013 | Nakai | G06F 1/1626 345/174 |
| 2013/0082618 A1* | 4/2013 | Hussain | G09G 3/3406 315/210 |
| 2013/0147756 A1* | 6/2013 | Chan | G06F 3/044 345/174 |

FOREIGN PATENT DOCUMENTS

JP 2011051427 3/2011

* cited by examiner

*Primary Examiner* — Sibin Chen
(74) *Attorney, Agent, or Firm* — BainwoodHuang

(57) ABSTRACT

A technique reduces erroneous judgment due to effects of noise accompanying PWM control while using PWM control for brightness adjustment of light-emitting diodes disposed proximate of an electrode. An electrode is disposed proximate of operating portions that are subject to touch operations by unit of a conductive body. An operating portion of a light-emitting diode is lightened. A CPU performs brightness adjustment of the light-emitting diode through PWM control. A detecting circuit outputs detected values in accordance with electrostatic capacitances of the electrode. The CPU judges that a touch operation has been made when a difference between a detected value of the detecting circuit and a reference value stored in a RAM is not less than a prescribed value. The CPU stores a detected value that is first detected by the detecting circuit after transition of an executing state of PWM control in the RAM as a reference value.

2 Claims, 9 Drawing Sheets

TOUCH SWITCH AND CONTROL PANEL

CROSS REFERENCE TO RELATED APPLICATIONS

This application is based on and claims the benefit of priority of Japanese Patent Application No. 2013-095784, filed on Apr. 30, 2013, the contents and teachings of which are hereby incorporated by reference in their entirety.

TECHNICAL FIELD

The present invention relates to an electrostatic capacitance type touch switch that detects touch operations of a conductive body such as a human body through changes in electrostatic capacitance and to a control panel comprising a plurality of such touch switches.

BACKGROUND ART

Control panels for air conditioning operations in vehicles are comprised with light-emitting diodes to make letters and symbols indicating functions allotted to switches easily readable and to display operating conditions of the switches. There are known brightness adjusting functions such as reducing the brightness of light-emitting diodes at night times. For realizing such brightness adjusting functions, PWM (pulse width modulation) control is generally employed which requires a small number of parts and involves low costs.

Touch switches of electrostatic capacitance type are widely used in these years due to reasons that they can realize simple designs free of unevenness and that they are free of malfunctions caused through wear of switch contacts.

Touch switches of electrostatic capacitance type include electrodes that are disposed proximate of operating portions that are subject to touch operations. Touch operations are detected based on changes in electrostatic capacitances in accordance with a conductive body such as a human body approaching these electrodes.

More particularly, detected values of sizes that are in accordance with electrostatic capacitances of the electrodes are obtained at constant time intervals by a detecting circuit. When a difference between the latest detected value and a reference value is less than a prescribed difference value $\Delta a$, it is judged that no touch operations have been made, and the reference value is updated to the latest detected value. When a difference between the latest detected value and a reference value is not less than a prescribed difference value $\Delta a$, it is judged that a touch operation has been made, and the reference value is not updated.

FIG. 9 is a time chart showing one example of changes in detected values.

In this case, while reference values are replaced by the latest detected values up to time point T11, the reference value is constant at Ra since the detected values Ra are constant.

At time point T12, since the difference between the latest detected value and the reference value is not less than the prescribed difference value $\Delta a$, the reference value is not updated but remains Ra. Accordingly, since all of the differences between the latest detected values and the reference values will be not less than the prescribed difference value $\Delta a$ until to the next time point T13, the reference value is not updated but remains Ra.

While the reference value is updated at time point T14 since the difference between the latest detected value and the reference value Ra is less than the prescribed difference value $\Delta a$, the reference value remains Ra since the latest detected value is Ra.

In this manner, the reference remains almost constant at Ra, and touch operations are detected during period P11 between time point T12 and time point T14.

CITATION LIST

Patent Literature

Patent Literature 1: Japanese Unexamined Patent Application Publication No. 2011-51427

SUMMARY OF THE INVENTION

Technical Problem

When the above-mentioned touch switches of electrostatic capacitance type are used in an air conditioning control panel of a vehicle, light-emitting diodes are disposed proximate of electrodes of the touch switches. In performing brightness adjustment of the light-emitting diodes through PWM control in such a configuration, variations in electrostatic capacitance of the electrodes will become large due to noise generated thereby so that there is the fear that erroneous judgments of touch operation occur.

While it is possible to reduce the above-mentioned effects of noise by employing a method of disposing the light-emitting diodes to be remote from the electrodes or a method of performing brightness adjustment by controlling amperages of the light-emitting diodes, both methods will result in an increase in the number of parts and thus in increased costs.

It is accordingly a purpose of the present invention to reduce the danger that erroneous judgments are made due to influences of noise accompanying PWM control while using PWM control for brightness adjustment of light-emitting diodes disposed proximate of electrodes.

Solution to Problem

For achieving the above purpose, the first invention is configured in that a touch switch comprising: operating portions that are subject to touch operations by a conductive body, electrodes disposed proximate of the operating portions, light-emitting elements that light up the operating portions, a brightness adjusting unit (or circuit) that performs brightness adjustment of the light-emitting elements through PWM (pulse width modulation) control, a memory device that stores therein a reference value, a detecting circuit that outputs a detected value in accordance with electrostatic capacitances of the electrodes, and a judging unit (or circuit) that judges that the touch operation is present when a difference between a detected value and a reference value stored in the memory device is not less than a prescribed value, wherein the touch switch is provided with a reference value changing unit (or circuit) that stores a detected value, which is the first value detected by the detecting circuit after transition of a state of executing the PWM control by the adjusting unit, in the memory device as the reference value.

For achieving the above purpose, the second invention is configured in that the touch switch wherein when the judging unit judges that the touch operation has been made when the detecting circuit makes a first detection after transition of the executing state of PWM control by the adjusting unit, the reference value changing unit of the first invention stores the first detected value, which is detected by the detecting circuit after the judging unit has judged that no touch operation has been made thereafter, as the reference value in the memory device.

For achieving the above purpose, the third invention is configured in that a control panel comprising a plurality of touch switches and a control unit (or circuit), each of the plurality of touch switches comprising: operating portions that are subject to touch operations by a conductive body, electrodes disposed proximate of the operating portions, light-emitting elements that light up the operating portions, a brightness adjusting unit for performing brightness adjustment of the light-emitting elements through PWM (pulse width modulation) control, and a detecting circuit that outputs a detected value in accordance with electrostatic capacitances of the electrodes, the control unit comprising: a memory device that stores reference values for each of the plurality of touch switches, a judging unit that judges for each of the plurality of touch switches that a touch operation has been made for a corresponding touch switch when a difference between a detected value detected by the detecting circuit that the corresponding touch switch comprises and a reference value for the corresponding touch switch that is stored in the memory device is not less than a prescribed value, and a reference value changing unit that stores a detected value, which is the first value detected by the detecting circuit after transition of the executing state of the PWM control by the adjusting unit, in the memory device as the reference value for the touch switch comprising the detecting circuit.

For achieving the above purpose, the forth invention is configured in that the control panel, wherein when the judging unit judges that the touch operation has been made to any of the plurality of touch switches when the detecting circuit makes a first detection after transition of the executing state of PWM control by the adjusting unit, the reference value changing unit of the third invention stores the first detected value, which is detected by the detecting circuit after the judging unit has judged that no touch operation have been made to any of the plurality of touch switches thereafter, as the reference value in the memory device.

For achieving the above purpose, the fifth invention is configured in that the control panel, wherein the reference value changing unit of the third invention confirms for each of the plurality of touch switches whether any one of a part of other touch switches that are predetermined for each of the touch switches is in a peripheral touched state for which it is judged by the judging unit that it is touch operated or not, and stores the first detected value, which is detected by the detecting circuit after the peripheral touched state has been cancelled for the touch switches in the peripheral touched state thereafter, as the reference value in the memory device.

Effects of Invention

According to the present invention, it is possible to reduce the danger that that erroneous judgments are made due to influences of noise accompanying PWM control.

DETAILED DESCRIPTION OF PREFERRED EMBODIMENTS

Embodiments of the present invention will now be explained while referring to FIG. 1 to FIG. 8.

In this respect, while embodiments will be explained here in which the present invention is applied to a control panel for air conditioning operations in a vehicle, the present invention is similarly applicable to control panels for other purposes.

First Embodiment

Figure 1:
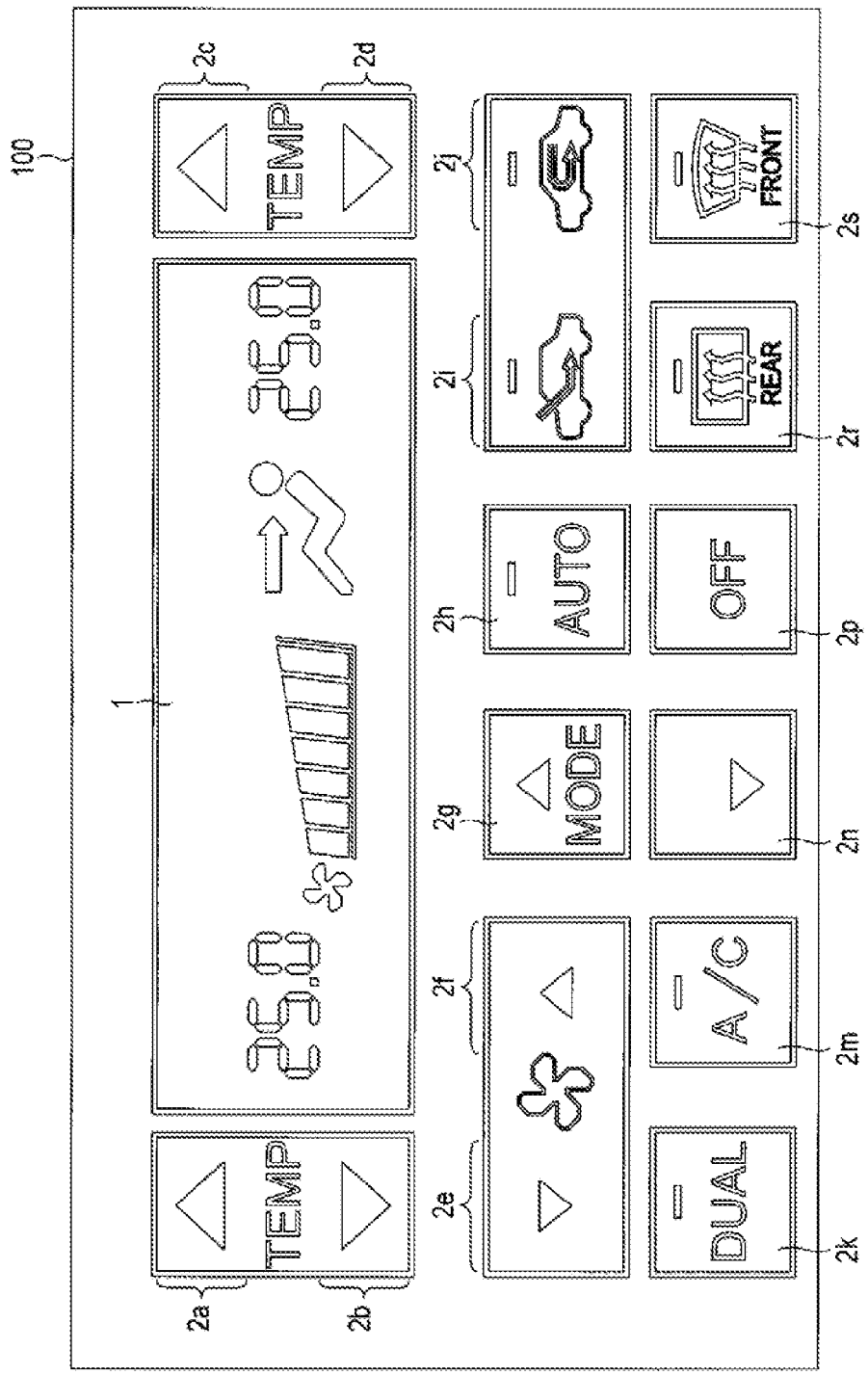
FIG. 1 is a plan view showing an external appearance of an operating surface of a control panel according to a first embodiment.

FIG. 1 is a plan view showing an external appearance of an operating surface of a control panel 100 according to a first embodiment.

The control panel 100 comprises a display device 1 and operating portions 2a, 2b, 2c, 2d, 2e, 2f, 2g, 2h, 2i, 2j, 2k, 2m, 2n, 2p, 2r, 2s which are in a state in which they are exposed to the exterior on an operating surface thereof.

The display device 1 is, for instance, a liquid crystal panel device and displays images representing working conditions of an air conditioning device in a vehicle.

The operating portions 2a to 2s are portions which are to be touch operated by an operator on the operating surface. Some portions of the operating portions 2a to 2s form letters or symbols by using a translucent material, and other portions are formed by using a lightproof material.

One electrode and at least one light-emitting diode are respectively disposed to oppose each of the operating portions 2a to 2s within the control panel 100.

Figure 2:
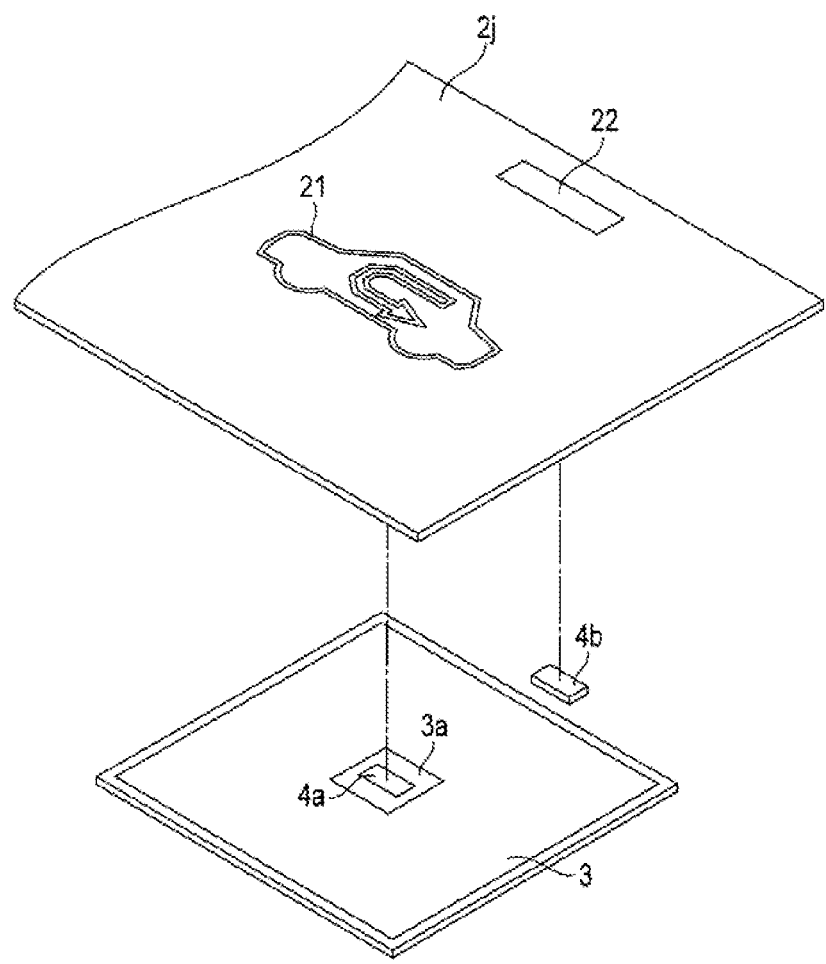
FIG. 2 is an exploded perspective view representing positional relationships between the control panel and electrodes as well as light-emitting diodes.

FIG. 2 is an exploded perspective view representing positional relationships between the operating portion 2j and an electrode 3 as well as light-emitting diodes 4a, 4b.

The operating portion 2j is formed with a symbol 21 and a state display window 22 using a translucent material. The symbol 21 includes a contour of a car and a U-shaped arrow and represents that the operating portion 2j is for selecting an interior air circulation mode. The state display window 22 represents a set/non-set state of the interior air circulation mode by emitting/non-emitting light.

The electrode 3 is formed in a thin sheet-like or thin film-like form using a conductive material. A front surface of the electrode 3 opposes the operating portion 2j. An aperture 3a is formed in a center of the electrode 3.

The light-emitting diode 4a is disposed within the aperture 3a such that its light-emitting surface faces the operating portion 2j. The light-emitting diode 4a opposes the symbol 21. The light-emitting diode 4a thus lights the symbol 21. This light-emitting diode 4a is one example of a light-emitting element. In this respect, it is possible to use a different type of light-emitting element instead of the light-emitting diode 4a.

The light-emitting diode 4b is disposed sideward of the electrode 3 such that its light-emitting surfaces faces the operating portion 2j. The light-emitting diode 4b opposes the state display window 22. The light-emitting diode 4b thus lights the state display window 22.

While illustration is omitted here, other operating portions of the control panel 100 are of similar configuration as that of FIG. 2. However, display windows of the other operating portions that correspond to the display window 21 have different shapes than that of the display window 21. Further, no display windows corresponding to the display window 22 are formed for the operating portions 2a, 2b, 2c, 2d, 2e, 2f, 2g, 2n, and no light-emitting diodes corresponding to the light-emitting diode 4b are provided to oppose these operating portions.

Figure 3:
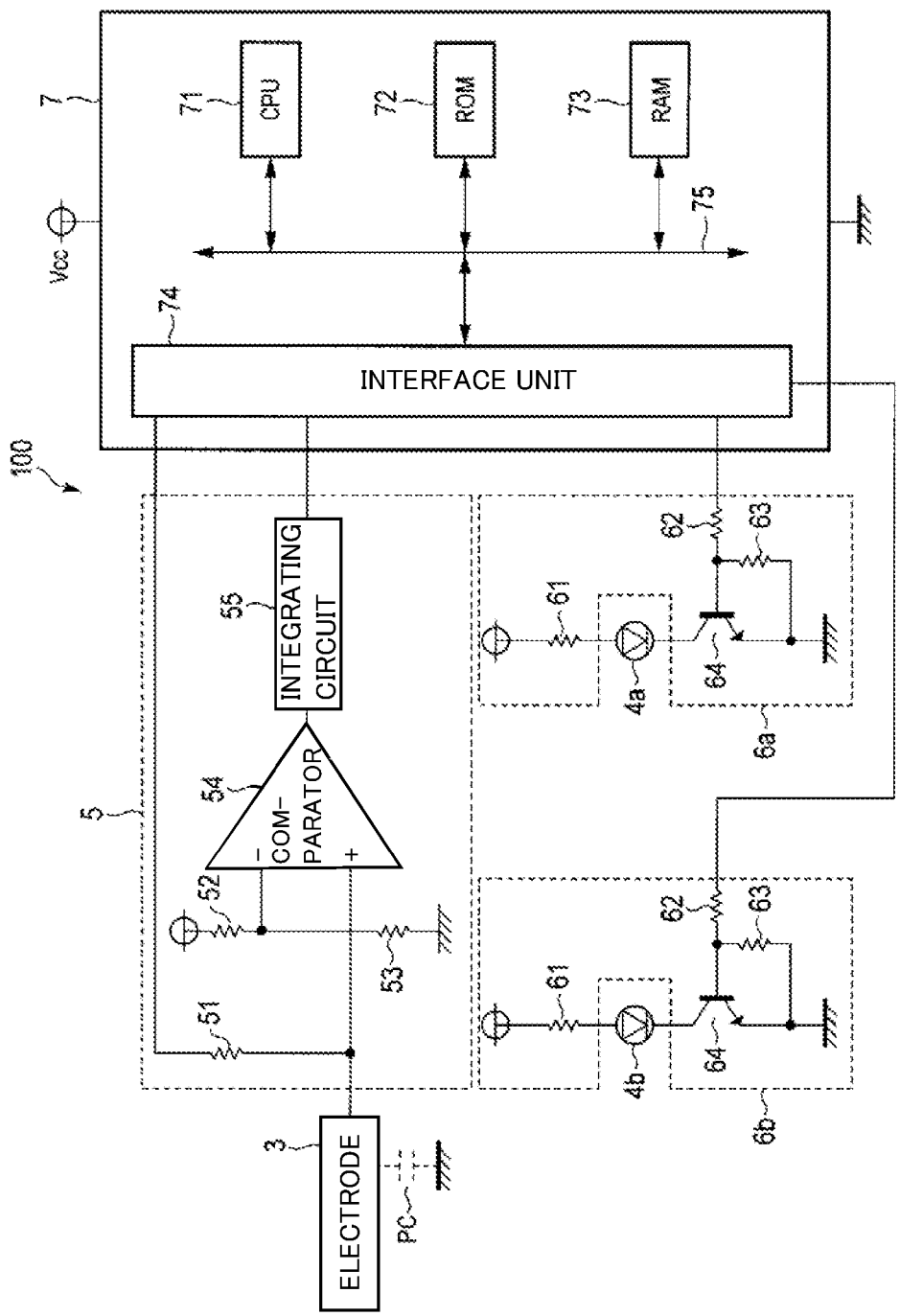
FIG. 3 is a view showing a part of electric elements of the control panel according to the first embodiment.

FIG. 3 is a view showing a part of electric elements of the control panel 100.

It should be noted that elements in FIG. 3 that are identical to those of FIG. 2 are marked with the same reference numbers.

As shown in FIG. 3, the control panel 100 includes a detecting circuit 5, driving circuits 6a, 6b and a control unit (or circuit) 7. In this respect, while the electrode 3, the light-emitting diode 4a, the detecting circuit 5 and the driving circuit 6a individually include elements corresponding to each of the operating portions 2a to 2s, and the driving circuit 6b individually includes elements corresponding to each of the operating portions 2h, 2i, 2j, 2k, 2m, 2r, 2s, only elements corresponding to the operating portion 2j from among these elements are illustrated in FIG. 3.

The detecting circuit 5 is a known circuit including resistors 51, 52, 53, a comparator 54 and an integrating circuit 55 which obtains detected values in accordance with electrostatic capacitance sizes of the electrode 3 and which sends the detected values to a control unit 7.

The driving circuits 6a, 6b are known circuits respectively including resistors 61, 62, 63 and a transistor 64. The driving circuit 6a drives the light-emitting diode 4a by being controlled by the control unit 7. The driving circuit 6b drives the light-emitting diode 4b by being controlled by the control unit 7.

The control unit 7 includes a CPU (central processing unit) 71, a ROM (read-only memory) 72, a RAM (random-access memory) 73, an interface unit (or circuit) 74 and a bus line 75. Each of the CPU 71, the ROM 72, the RAM 73 and the interface unit 74 is connected to the bus line 75. In other words, it is possible to use, for instance, a microcomputer as the control unit 7.

The CPU 71 performs processes for judging presence/absence of touch operations to each of the operating portions 2a to 2s, for switching the light-emitting diodes ON/OFF and for brightness adjustment of light-emitting diodes in accordance with programs stored in the ROM 72.

The ROM 72 stores the above-mentioned programs and various data that the CPU 71 refers to in performing various processes.

The RAM 73 is used as a working area for temporally storing data when the CPU 71 performs various processes.

The interface unit 74 provides square waves to one port of the resistor 51 of the detecting circuit 5. The interface unit 74 takes in detected data that are output from the integrating circuit 55 of the detecting circuit 5. The interface 74 outputs switching signals to the driving circuit 6. In this respect, the detecting circuit and the driving circuit for other operating portions are also connected to the interface circuit 74. The interface unit 74 performs the same operations as mentioned above for those detecting circuits and driving circuits.

In this manner, a single touch switch is configured to include the operating portion 2j, the electrode 3, the light-emitting diodes 4a, 4b, the detecting circuit 5, the driving circuits 6a, 6b and the control unit 7. Touch switches are similarly configured for the remaining operating portions 2a to 2i and 2k to 2s. However, touch switches related to the operating portions 2a to 2g, 2n, 2p do not comprise the light-emitting diode 4b and the driving circuit 6b. Accordingly, the control panel 100 comprises 16 touch switches.

Operations of the thus configured control panel 100 will now be explained.

Figure 4:
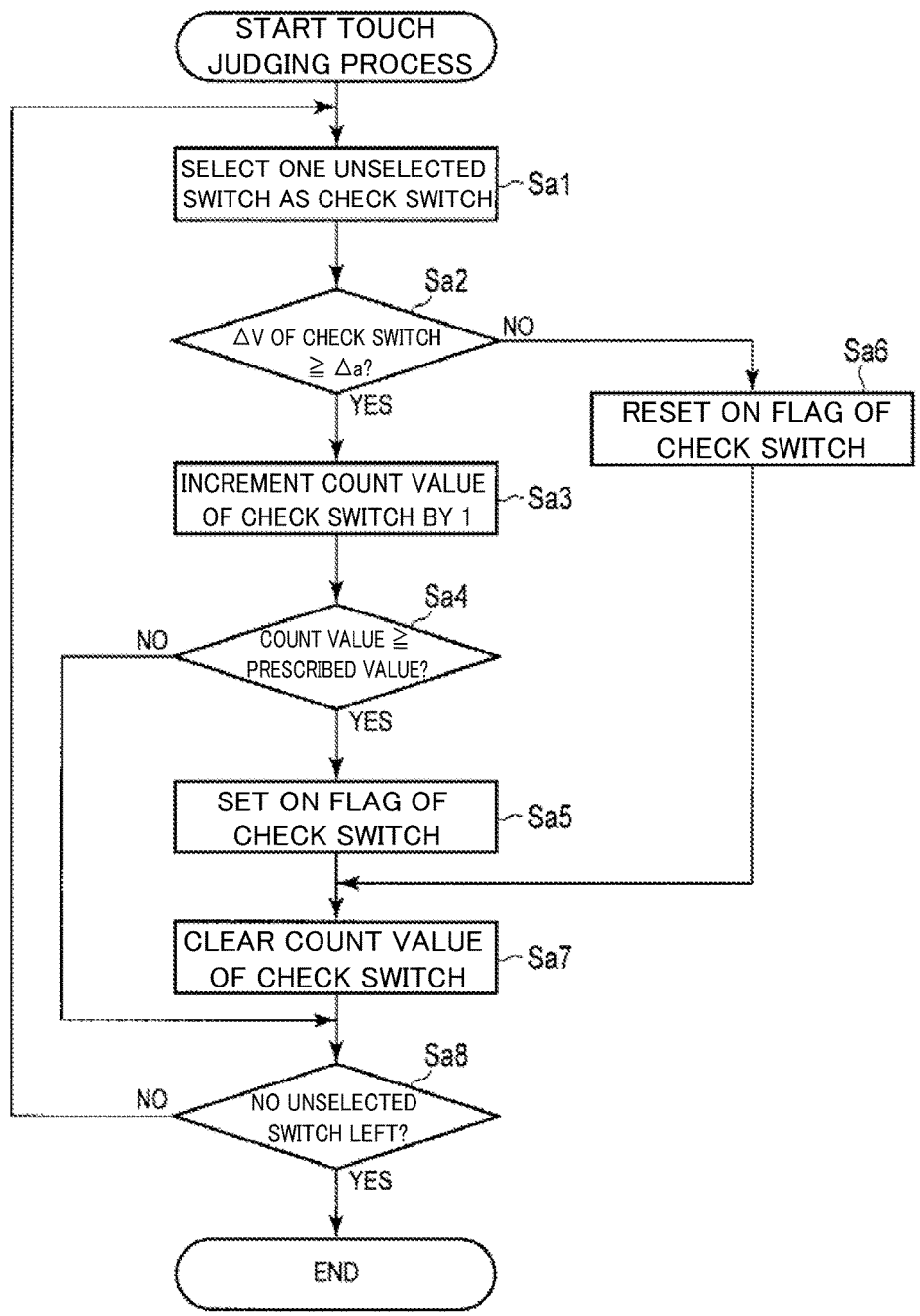
FIG. 4 is a flowchart of a touch judging process performed by a CPU in FIG. 3.

The CPU 71 repeatedly starts touch judging processes as shown in FIG. 4 at constant time intervals.

In step Sa1, the CPU 71 selects one out of all touch switches that the control panel 100 comprises that has not been selected yet in the current touch judging process as a check switch.

In step Sa2, the CPU 71 confirms whether a detected value difference $\Delta V$ of the check switch is not less than a prescribed difference value $\Delta a$ or not. Here, the detected value difference $\Delta V$ is a difference between a detected value that is output by the detected circuit 5 included in the check switch at this point of time and a reference value judged of the check switch through a reference value updating process to be described later. In this respect, reference values are stored in the RAM 73 for each of the plurality of touch switches. The RAM 73 is accordingly one example of a memory device. It is also possible to provide an EEPROM or the like other than the RAM 73 in order to store reference values therein.

In principle, the detecting circuit 5 outputs detected values of sizes that are in accordance with electrostatic capacitances related to the electrode 3. Parasitic capacitances (stray capacitances) PC that are generated between the electrode and a ground pattern formed on the printed circuit board are constantly present as the electrostatic capacitances related to the electrode 3. When a conductive body such as a human body approaches the electrode 3, electrostatic capacitance is generated between the conductive body and the electrode 3. Since the thus generated electrostatic capacitance is larger than the parasitic capacitance PC, the electrostatic capacitance related to the electrode 3 will largely vary depending on the presence/absence of an approaching conductive body. While sizes of the electrostatic capacitance generated between the conductive body and the electrode 3 changes depending on the conductivity of the conductive body or the positional relationships between the conductive body and the electrode 3, the amount of change is smaller than the amount of change in electrostatic capacitance depending on the presence/absence of an approaching conductive body. While the detected values also change depending on ambient temperature or humidity, the amount of change is smaller than the amount of change in detected values depending on the presence/absence of an approaching conductive body. The prescribed difference value $\Delta a$ is predetermined by a designer or the like as an intermediate value of the amount of change in detected values depending on the presence/absence of touch operations and the amount of change in detected value due to other factors.

When it has been judged YES in step Sa2 since the detected value difference ΔV of the check switch is not less than the prescribed difference value Δa, the CPU 71 proceeds to step Sa3.

In step Sa3, the CPU 71 increments a count value of the check switch by 1. The count values are stored in the RAM 73 wherein sixteen thereof are provided in connection with each of all the touch switches. In this respect, the count values are all cleared to zero when, for instance, the control panel 100 is started up.

In step Sa4, the CPU 71 confirms whether the count value of the check switch is not less than a prescribed value or not. The prescribed value is suitably judged by a designer or the like. When it is judged YES since a corresponding count value of the check switch is not less than the prescribed value, the CPU 71 proceeds to step Sa5.

In step Sa5, the CPU 71 sets an ON flag of the check switch. The ON flag is a piece of data of 1 bit stored in the RAM 73, wherein sixteen thereof are provided in connection with each of all the touch switches. The ON flag is a flag representing whether a related touch switch has been touch operated or not wherein a set state represents a state in which touch operation has been made. In other words, the CPU 71 judges at this time that the check switch is in a touch operated state and sets the ON flag to a set state. Thereafter, the CPU 71 proceeds to step Sa1.

By the way, when it is judged NO in step Sa2 since the detected value difference ΔV for the check switch is less than the prescribed difference value Δa, the CPU 71 proceeds to step Sa6.

In step Sa6, the CPU 71 resets the ON flag of the check switch. However, the ON flag of the check switch might already be in a reset state at this time, and it does not necessarily mean that the ON flag state is updated. Thereafter, the CPU 71 proceeds to step Sa1.

In step Sa1, the CPU 71 clears the count value of the check switch to zero. In other words, upon setting or resetting the ON flag, the CPU 71 clears the counter value. Thereafter, the CPU 71 proceeds to step Sa8.

In this respect, when it is judged NO in step Sa4 since the count value of the check value is less than the prescribed value, the CPU 71 skips steps Sa5 and Sa7 and proceeds to step Sa8. In other words, the CPU 71 does not change the ON flag state of the check switch and the count value of the check switch remains the value that has been updated in step Sa3.

In step Sa8, the CPU 71 confirms whether there is any touch switch of all the touch switches comprised by the control panel 100 that has not been selected in the current touch judgment processes or not. When it is judged NO since any unselected touch switches are left, the CPU 71 returns to step Sa1 and repeats the above-mentioned processes using other touch switches as the check switch. When it is judged YES in step Sa8 since no unselected touch switches are left, the CPU 71 terminates the current touch judgment process.

In this manner, in a single touch judging process, it is confirmed for each of the touch switches whether the detected value difference ΔV is not less than the prescribed difference value Δa, a count value of touch switches of which the detected value difference ΔV is not less than the prescribed difference value Δa are incremented by 1, and it is judged that touch switches which count values after increment has become not less than the prescribed value are in touch operated states. In this respect, since count values represent the number of continuous times in which the detected value difference ΔV is in a state in which it is not less than the prescribed difference value Δa, it is judged that the touch switch is in a touch operated state when the state in which the detected value difference ΔV is not less than the prescribed difference value Δa has continued for a prescribed number of times.

Figure 5:
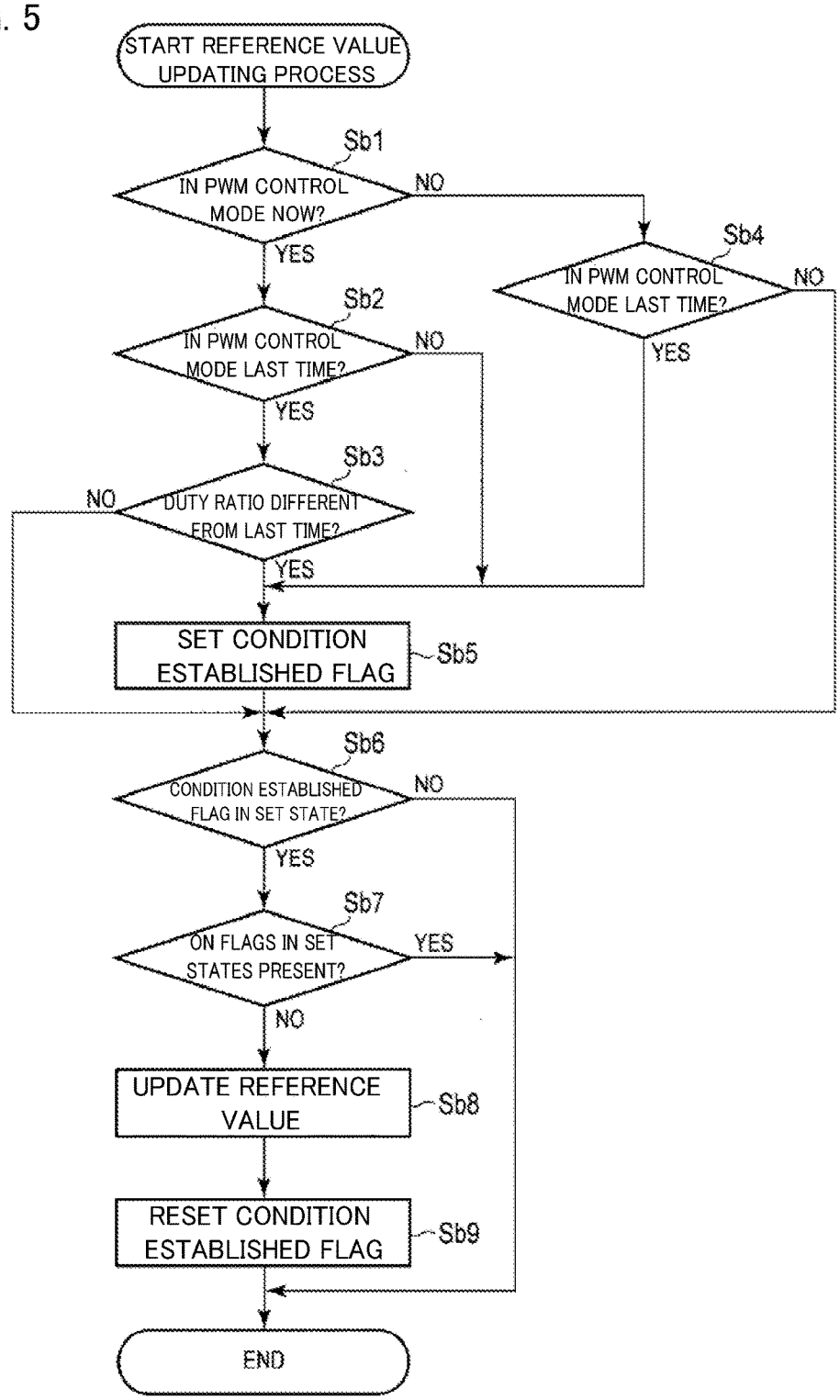
FIG. 5 is a flowchart of a reference value updating process performed by the CPU in FIG. 3.

On the other hand, the CPU 71 repeatedly starts a reference value updating process as shown in FIG. 5 at constant time intervals. In this respect, the timing for starting the reference value updating process might be unrelated to the timing for starting the touch judging process, and the interval of executing the reference updating process is typically wider than the interval of executing the touch judging process. The interval of executing the reference updating process and the interval of executing the touch judging process are predetermined suitably by a designer or the like.

In step Sb1, the CPU 71 confirms whether the PWM control mode is applied for controlling either one of the light-emitting diodes 4a, 4b. In this respect, application/non-application of the PWM control mode or duty ratios during PWM control are respectively common among the plurality of light-emitting diodes 4a and among the plurality of light-emitting diodes 4b. When it is judged YES since the PWM control mode is applied, the CPU 71 proceeds to step Sb2.

In step Sb2, the CPU 71 confirms whether the PWM control mode has been applied the last time the reference value updating process was executed as it is the case with the current time. When it is judged YES since the PWM control mode had been applied last time as it is the case with the current time, the CPU 71 proceeds to step Sb3.

In step Sb3, the CPU 71 confirms whether the duty ratio of the current PWM control is different from the duty ratio of the PWM control when the reference value updating process was executed last time. When it is judged YES since both duty ratios differ from each other, the CPU 71 proceeds to step Sb5.

In this respect, when it is judged NO in step Sb2 since the PWM control mode had not been applied when the reference value updating process was executed last time as it is the case with the current time, the CPU 71 skips steps Sb2 and Sb3 and proceeds to Step Sb5.

Now, when it is judged NO in step Sb1 since the PWM control mode is currently not applied, the CPU 71 proceeds to step Sb4.

In step Sb4, the CPU 71 confirms whether the PWM control mode had been applied for controlling either one of the light-emitting diodes 4a, 4b when the reference value updating process was executed last time or not. When it is judged YES since the PWM control mode had been applied last time, the CPU 71 proceeds to step Sb5.

In this manner, the CPU 71 proceeds to step Sb5 when any one of the following three cases applies.

(1) When the PWM control mode is similarly continuing from the last to the current time but the duty ratio has changed.

(2) When the PWM control mode had been terminated for controlling at least one of the light-emitting diodes 4a, 4b from the last to the current time.

(3) When the PWM control mode had been started for controlling at least one of the light-emitting diodes 4a, 4b from the last to the current time.

In other words, the CPU 71 proceeds to step Sb5 when state transitions related to PWM control had occurred from the last to the current time.

In this respect, PWM control is realized through processes of another task of the CPU 71. In other words, the CPU 71 functions as a brightness adjusting unit. Accordingly, the CPU 71 manages the PWM control states, and judgment of steps Sb1 to Sb4 can be executed by referring information thereof.

Specific examples in which the control panel 100 is mounted to a vehicle will now be described.

First Specific Example

When a light switch of the vehicle is in a meter lighting OFF state (hereinafter referred to as "light OFF state"), the CPU 71 sets the LED 4a to a non-lighting (non-conductive) state, and to a lighting state at maximum light intensity (normal electrification) when in a meter lighting ON state (hereinafter referred to as "light ON state").

When the allotted mode is in a set state, the CPU 71 sets the LED 4b to a lighting (conductive) state and to a non-lighting (non-conductive) state when it is in a non-set state. Note that the amount of luminescence in the lighting state of the LED 4b is defined to be a maximum light intensity in the light OFF state while it has a reduced light intensity that is lower than the maximum light intensity in the light ON state. Provided that the maximum light intensity is 100%, the reduced light intensity is assumed to be, for instance, approximately 20%.

When the CPU 71 controls the LEDs 4a, 4b under the above-mentioned conditions, PWM control is applied when the LED 4b lights at reduced light intensity, that is, when it is in the light ON state and when the mode allotted to the LED 4b is a set state while no PWM control is applied in any other states.

Accordingly, state transitions related to PWM control are caused when switching between the light OFF state and the light ON state has been performed when the mode allotted to the LED 4b is a set state and when switching between setting/non-setting of the mode allotted to the LED 4b has been performed in the light ON state.

In this respect, no changes are made in the duty ratio of PWM control in this specific example. Accordingly, it will always be judged NO in step Sb3. It is therefore possible to omit step Sb3 and to proceed to step Sb6 when it has been judged YES in step Sb2.

Second Specific Example

While the CPU 71 similarly controls lighting/non-lighting of the LEDs 4a, 4b as in the first specific example, the amount of luminescence of the LED 4a in the light ON state is changed in accordance with operations of a light adjusting switch or the like.

When the CPU 71 thus controls the LEDs 4a, 4b, PWM control is applied when the LED 4a is in a light ON state and the amount of luminescence thereof is not the maximum light intensity in addition to a case in which the LED 4b is in a light ON state and the mode allotted thereto is a set state.

Thus, state transitions related to PWM control are caused in any one of the following cases.

(1) When switching between the light OFF state and light ON state has been performed when the mode allotted to the LED 4b is a set state.

(2) When switching between setting/non-setting of the mode allotted to the LED 4b has been performed in the light ON state.

(3) When switching between the light OFF state and the light ON state has been performed when the amount of luminescence of the LED 4a is set to a state other than the maximum light intensity.

(4) When the amount of luminescence of the LED 4a has been changed in the light ON state.

In step Sb5, the CPU 71 sets a condition established flag. The condition established flag is a piece of data of 1 bit that is stored in the RAM 73. Thereafter, the CPU 71 proceeds to step Sb6.

In this respect, when it is judged NO in step Sb3 since the PWM control mode is continuing from the last to current time and the duty ratio has not been changed and when it is judged NO in step Sb4 since no PWM control mode has been applied neither the last nor the current time, the CPU 71 proceeds to step Sb6 without executing step Sb5. In other words, the condition established flag is set only in one of the above-mentioned cases (1) to (3).

In step Sb6, the CPU 71 confirms whether the condition established flag is in a set state or not. When it is judged YES since it is in a set state, the CPU 71 proceeds to step Sb7.

In step Sb7, the CPU 71 confirms whether there are any ON flags from among the ON flags corresponding to each of the touch switches in a set state. When it is judged NO since all of the ON flags are in a reset state, the CPU 71 proceeds to step Sb8.

In step Sb8, the CPU 71 updates the reference value stored in the RAM 73. The CPU 71 sequentially acquires detected values that are output from the detecting circuits 5 of the respective touch switches at this point of time through the interface unit 74 and rewrites reference values of corresponding touch switches using these detected values.

In step Sb9, the CPU 71 resets the condition established flag. With this, the CPU 71 terminates the reference value updating process.

In this respect, when it is judged NO in step Sb6 since the condition established flag is in a reset state and when it is judged YES in step Sb7 since while the condition established flag is in a set state but there is any ON flag in a set state, the CPU 71 terminates the reference value updating process without executing steps Sb8 and Sb9.

Through such a reference value updating process, reference values are updated at the time of start or end of PWM control or in the presence of state transitions in PWM control due to changes in duty ratios of PWM control or the like by using a first value that is detected thereafter. Reference values are not updated even though changes occur in detected values at other timings. In other words, the CPU 71 functions as a reference value updating unit by the executing reference value updating process.

Figure 6:
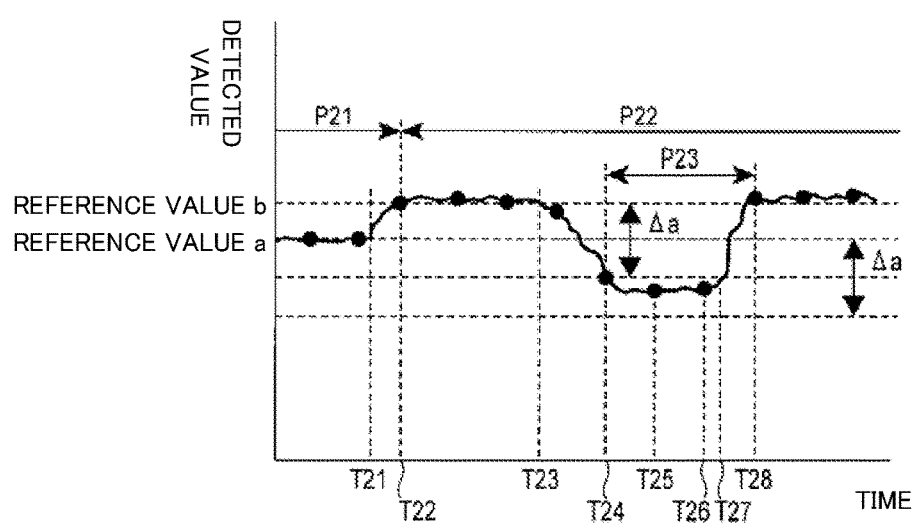
FIG. 6 is a view showing one example of changes in detected values detected by a detecting circuit in FIG. 5.

FIG. 6 is a view showing one example of changes in detected values.

In FIG. 6, the thick lines represent changes of values that are to be detected as detected values and the black dots represent values that are detected by the detecting circuits 5.

The value at the initial time point shown in FIG. 6 is the reference value a.

At time point T21, a state transition related to PWM control occurs. At time point T22 at which the next detected value is detected by the detecting circuit 5, the detected value is used to update to reference value b. Thus, the reference value is fixed to reference value a for period P21 while it is fixed to reference value b for period P22 with the time point T22 being held between.

Touch operations are started at time point T23. The detected values consequently reduce, and the differences between the detected values at time points T24, T25, T26 and the reference value b are not less than the prescribed difference value Δa.

Touch operations are terminated at point T27. The detected value consequently increases and the difference between the detected value at time point T28 and the reference value b is less than the prescribed difference value Δa. Thus, it is judged by the CPU 71 that touch operations are made during period P23 ranging from time point T24 to time point T28.

Thus, according to the present embodiment, the reference value in a period in which the state of PWM control continuously remains the same is fixed to the detected value that is detected at the beginning of the period. Accordingly, erroneous detection of touch operation is prevented thereby even though detected values frequently change by being affected through noise accompanying PWM control.

In this respect, in the presence of a single ON flag in a set state out of the ON flags corresponding to the respective touch switches even though the condition established flag is in a set state, the CPU 71 judges YES in step Sb7 and terminates the reference value updating process without executing steps Sb8 and Sb9. In this case, the next reference value updating process is started with the condition established flag remaining in the set state. Accordingly, CPU 71 will judge YES in step Sb6 irrespective of how steps Sb1 to Sb5 are executed in the following reference value updating process and executes judgment in step Sb7. In other words, it is awaited until it can be judged NO in step Sb7 when all ON flags are in a reset state.

Then, when all ON flags are in a reset state, that is, when no touch operations are made to any of the touch switches, the reference value is updated irrespective of the presence/absence of state transitions in PWM control.

The electrostatic capacitance related to a single touch switch might change also in case no touch operations are made to the touch switch itself but in case touch operations are made to other adjoining touch switches. Accordingly, even in the presence of a state transition related to PWM control in a state in which touch operations are made to any one of the plurality of touch switches included in the control panel 100 as mentioned above, detected values that have been detected in such a state are will not become a reference value. It is then awaited until no touch operations are made to any of the touch switches and the detected value that is detected in this state is updated as the reference value for the state after transition.

With this arrangement, a detected value that has been detected in a state in which it is not affected by touch operations is set as a reference value so that is possible to set a reference value that is appropriate for detecting touch operations.

Second Embodiment

The configuration as shown in FIG. 2 is an example employing a so-called self-capacitance method, but the above-described embodiment can be utilized as it is also when employing a mutual capacitance method.

Figure 7:
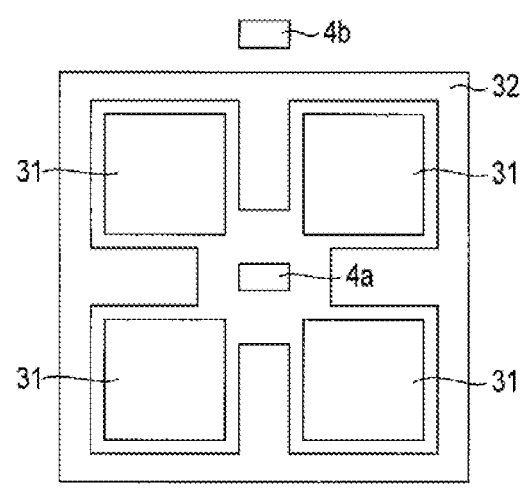
FIG. 7 is a plan view showing a configuration of electrodes in a single touch switch according to a second embodiment.

FIG. 7 is a plan view showing a configuration of electrodes in a single touch switch according to the second embodiment. In this respect, elements in FIG. 7 that are identical to those shown in FIG. 2 are marked with the same reference numbers and detailed explanations thereof will be omitted.

As shown in FIG. 7, when the mutual capacitance method is employed, a single touch switch includes a plurality of reception electrodes 31 and at least one transmission electrode 32. In this respect, FIG. 7 illustrates a case that is comprised of four reception electrodes 31 and one transmission electrode 32.

Figure 8:
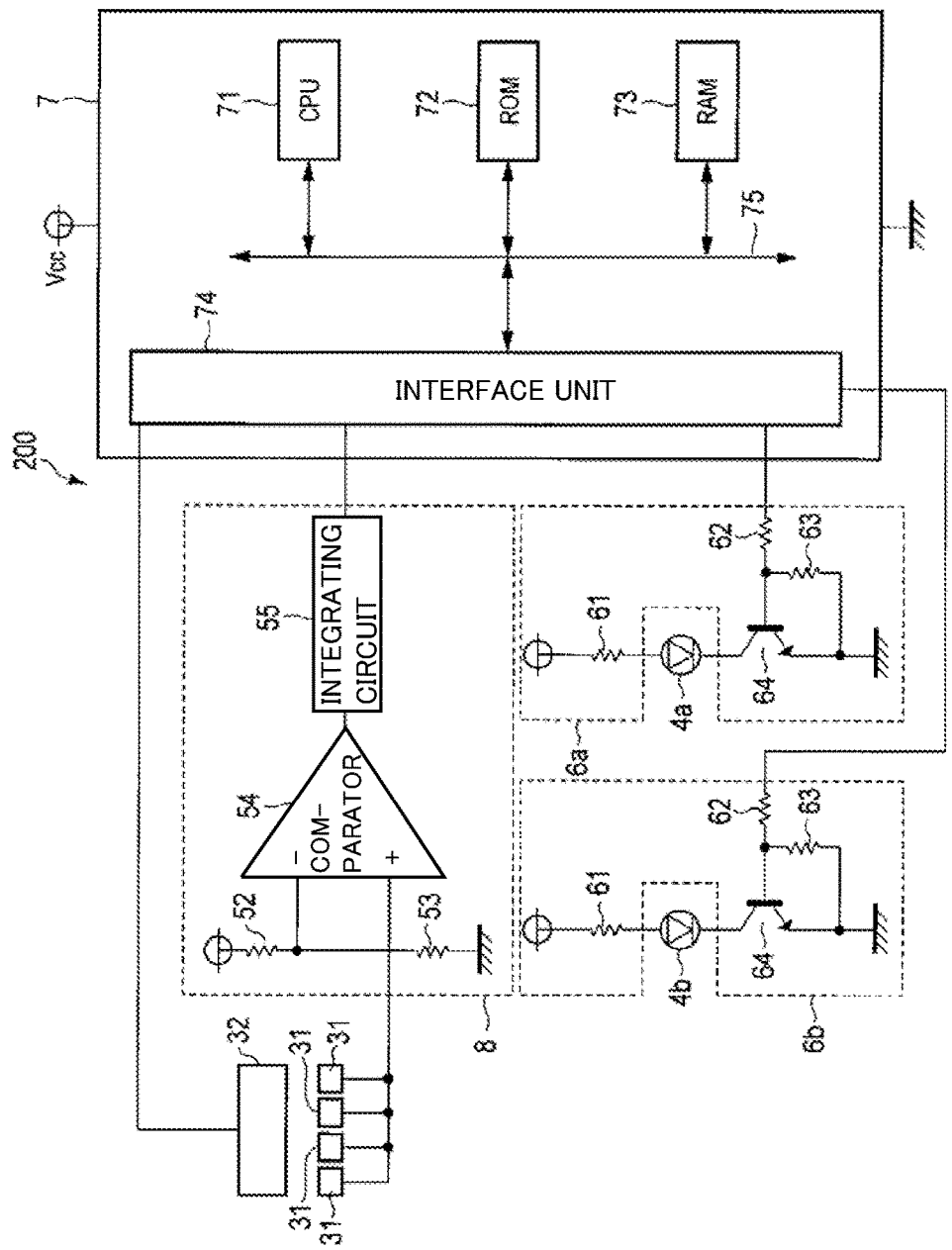
FIG. 8 is a view showing a part of electric elements of the control panel according to the second embodiment.
Figure 9:
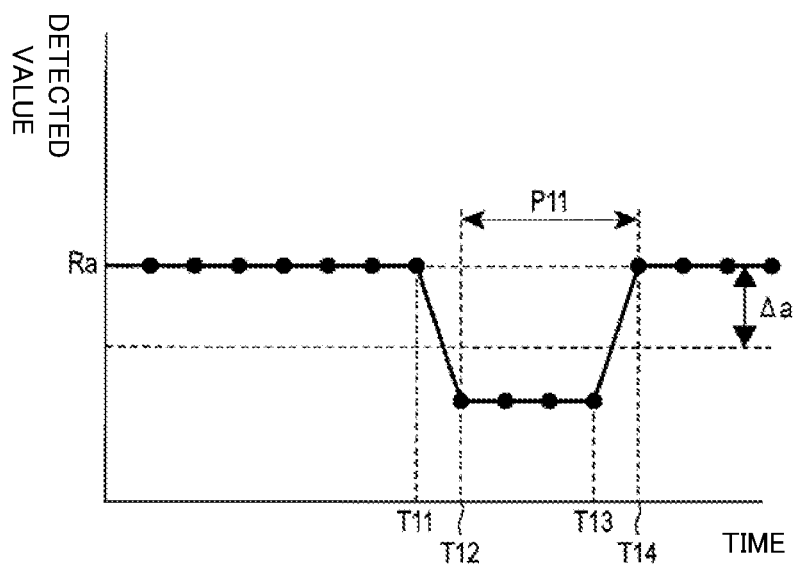
FIG. 9 is a time chart explaining a conventional detecting process of touch operation.

FIG. 8 is a view showing a part of electric elements of a control panel 200 according to the second embodiment. In this respect, elements in FIG. 8 that are identical to those shown in FIG. 3 and FIG. 7 are marked with the same reference numbers and detailed explanations thereof will be omitted.

The control panel 200 as shown in FIG. 8 employs the electrode configuration as shown in FIG. 7. The control panel 200 has an electrode configuration that is changed as mentioned above and comprises a detecting circuit 8 instead of the detecting circuit 5. No square waves that are output from the interface unit 74 are supplied to the detecting circuit 8 so that no resistor 51 is provided accordingly.

Square waves that are output from the interface unit 74 are supplied to the transmission electrode 32. All of the reception electrodes 31 are connected to a non-inverting input port of the comparator 54.

In such a configuration, an electric field is generated between the transmission electrode 32 and the reception electrodes 31 upon supplying square waves to the transmission electrode 32. When a conductive body such as a finger approaches the reception electrodes 31, a part of the energy of the above-mentioned electric field will be absorbed by the conductive body so that the above-mentioned electric field reduces. Since the electrostatic capacitance related to the reception electrodes 31 reduces in accordance with the reduction in the electric field, it is possible to judge the presence/absence of touch operations similar to first embodiment as a change in detected values that are obtained by the detecting circuit 8.

However, while the electrostatic capacitance increases in accordance with touch operations in first embodiment, the electrostatic capacitance reduces in accordance with touch operations in second embodiment. As for the touch judging process and reference value updating process of the CPU 71, it is possible to apply the same processes as those of Example 1 as they are. However, since there are possibilities that differences are generated in the amount of changes in the detected values depending on the presence/absence of touch operations, it is necessary to suitably define the value of the prescribed difference value Δa accordingly.

By employing the mutual capacitance method, it is possible to improve noise immunity when compared to first embodiment.

In this respect, the present invention is not limited to the above-described first embodiment and second embodiment but it is also possible to make modifications as follows.

The number and arrangement of touch switches that are comprised by the control panel can be arbitrary.

It is possible to realize the present invention not as a control panel but as an individual touch switch.

The reference value updating process might be individually performed for each of the plurality of touch switches and it is possible to confirm in step Sb7 whether touch operations have been made to target touch switches. In other words, it is possible to update reference values even when touch operations have been made to other touch switches.

The reference value updating process might be individually performed for each of the plurality of touch switches, and it is possible to confirm whether touch operations have been made to a part of touch switches that are affected thereby from among the other touch switches. In other words, depending on the arrangement of the plurality of touch switches, it might be that touch operations to other touch switches that are located far away will not affect certain touch switches. Accordingly, in such instances, the presence/absence of touch operations to touch switches that have no effects is ignored so as to increase the possibility of smoothly updating the reference value. More specifically, one possible way is to confirm in step Sb7, for instance for a touch switch including operating portion $2k$, whether touch operations are being made to any one of operating portions $2e$, $2f$ or $2m$.

It goes without saying that other various modifications are possible without departing from the gist of the present invention.

REFERENCE MARKS IN THE DRAWINGS $2a$-$2s$ Operating Portion
3 Electrode
$4a$, $4b$ Light-Emitting Diode
5, 8 Detecting Circuit
$6a$, $6b$ Driving Circuits
7 Control Unit
71 CPU
72 ROM
73 RAM
74 Interface Unit
31 Reception Electrodes
32 Transmission Electrode
100, 200 Control Panel

The invention claimed is:

1. A control panel comprising a plurality of touch switches and a control unit, each of the plurality of touch switches comprising:

operating portions that are subject to touch operations by a conductive body, electrodes disposed proximate of the operating portions, light-emitting elements that light up the operating portions, a light switch that lights on the light-emitting elements, a brightness adjusting unit for performing brightness adjustment of the light-emitting elements through PWM (pulse width modulation) control, and a detecting circuit that outputs a detected value in accordance with electrostatic capacitances of the electrodes, the control unit comprising:

a memory device that stores a reference value for each of the plurality of touch switches, a judging unit that judges for each of the plurality of touch switches that a touch operation has been made for a corresponding touch switch when a difference between the detected value detected by the detecting circuit that the corresponding touch switch comprises and the reference value for the corresponding touch switch that is stored in the memory device is not less than a prescribed value, and for the light-emitting elements that are in a light on state, a reference value changing unit that stores the detected value, which is a first value detected by the detecting circuit after transition of the executing state of the PWM control by the brightness adjusting unit, in the memory device as the reference value for the touch switch comprising the detecting circuit, wherein when the judging unit judges that the touch operation has been made to any of the plurality of touch switches when the detecting circuit makes a first detection after transition of the executing state of PWM control by the brightness adjusting unit, the reference value changing unit stores the first detected value, which is detected by the detecting circuit after the judging unit has judged that no touch operation have been made to any of the plurality of touch switches thereafter, as the reference value in the memory device.

2. The control panel as claimed in claim 1, wherein the reference value changing unit confirms for each of the plurality of touch switches whether any one of a part of other touch switches that are predetermined for each of the touch switches is in a peripheral touched state for which it is judged by the judging unit that it is touch operated or not, and stores the first detected value, which is detected by the detecting circuit after the peripheral touched state has been cancelled for the touch switches in the peripheral touched state thereafter, as the reference value in the memory device.

* * * * *